United States Patent
Cox

(10) Patent No.: US 6,362,687 B2
(45) Date of Patent: *Mar. 26, 2002

(54) APPARATUS FOR AND METHOD OF CONTROLLING AMPLIFIER OUTPUT OFFSET USING BODY BIASING IN MOS TRANSISTORS

(75) Inventor: David F. Cox, Los Lunas, NM (US)

(73) Assignee: Science & Technology Corporation, Albuquerque, NM (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,972

(22) Filed: May 24, 1999

(51) Int. Cl.$^7$ .................................................. H03F 3/45
(52) U.S. Cl. ...................................... 330/253; 330/259
(58) Field of Search ................................. 330/253, 259, 330/261, 277, 290, 296

(56) References Cited

U.S. PATENT DOCUMENTS

| | | | |
|---|---|---|---|
| 3,609,414 A | | 9/1971 | Pleshko et al. ............. 307/310 |
| 4,142,114 A | | 2/1979 | Green ......................... 307/304 |
| 4,538,114 A | * | 8/1985 | Kunimi et al. .............. 330/253 |
| 4,670,670 A | | 6/1987 | Shoji ........................... 307/297 |
| 4,806,875 A | * | 2/1989 | Schaffer ................. 330/259 X |
| 5,210,505 A | * | 5/1993 | Eddlemon ................... 330/253 |
| 5,682,118 A | | 10/1997 | Kaenel et al. ............... 327/534 |
| 5,744,996 A | | 4/1998 | Kötzle et al. ............... 327/534 |
| 6,018,268 A | * | 1/2000 | Tan ............................. 330/253 |

OTHER PUBLICATIONS

Gutnik et al., "Embedded Power Supply for Low–Power DSP,"Dec. 1997, ppg. 425–440, IEEE Transactions on Very Large Scale Integration (VLSI) Systems, vol. 5, No. 4.

Miyazaki et al, "A Delay Distribution Squeezing Scheme with Speed–Adaptive Threshold–Voltage CMOS (SA–Vt CMOS) for Low Voltage SLIs," 1998, pp. 48–53, ISLPED98, Monterey, CA.

* cited by examiner

Primary Examiner—Steven J. Mottola
(74) Attorney, Agent, or Firm—Haverstock & Owens LLP

(57) ABSTRACT

Method and apparatus for controlling amplifier output offset using body biasing in MOS transistors. A pair of input transistors have isolated bodies. A differential input signal is applied across the gates of the input transistors. An output signal is derived from a voltage at the drain of one of the input transistors. A feedback loop includes an integrator and a feedback amplifier. The integrator integrates the output signal, thereby forming an integrated output signal. The integrated output signal is applied to a first input of the feedback amplifier, while a reference voltage is applied to a second input of the feedback amplifier. The feedback amplifier controls the voltage of the body of one of the input transistors. The body of the other input transistor is coupled to its source. The threshold voltage of the input transistor having its body coupled to the feedback amplifier is controlled such that a quiescent level of the output signal tends to equal the reference voltage. A time constant associated with the feedback loop is sufficiently long that frequencies of interest for the input differential signal pass to the output of the amplifier without affecting the bias voltage formed by the feedback loop. A comparator differs from the amplifier in that the integrator and feedback amplifier are omitted and, instead, a second reference voltage is applied directly to the body of the input transistor having its body voltage controlled. The offset voltage is reduced or eliminated by adjusting the second reference voltage.

29 Claims, 3 Drawing Sheets

APPARATUS FOR AND METHOD OF CONTROLLING AMPLIFIER OUTPUT OFFSET USING BODY BIASING IN MOS TRANSISTORS

FIELD OF THE INVENTION

The present invention relates to the field of amplifier and comparator circuits which are implemented utilizing a differential amplifier. More particularly, the present invention relates to the field of amplifier and comparator circuits utilizing a differential amplifier and having a controllable output offset.

BACKGROUND OF THE INVENTION

Differential amplifiers are commonly utilized for amplifying signals and for comparing signal levels. FIG. 1 illustrates a conventional differential amplifier circuit. A high potential supply $V_{cc}$ is coupled to a source of a PMOS transistor M1 and to a source of a PMOS transistor M2. A drain of the transistor M1 forms an inverting output terminal of the differential amplifier and is coupled to a drain of an NMOS transistor M3. A drain of the transistor M2 forms a non-inverting output terminal of the differential amplifier and is coupled to a gate of the transistor M1, to a gate of the transistor M2 and to a drain of an NMOS transistor M4. A gate of the transistor M3 forms a non-inverting input of the differential amplifier, while a gate of the transistor M4 forms an inverting input of the differential amplifier. A source of the transistor M3 and a source of the transistor M4 are coupled together and to first terminal of a current source I1. A second terminal of the current source I1 is coupled to a low potential supply Vss.

The current source I1 provides bias current for the transistors M1, M2, M3 and M4. An input signal Vin+ is applied to the gate of the transistor M3, while an input signal Vin− is applied to the gate of the transistor M4. Together, the signals Vin+ and Vin− form an input differential signal [(Vin+)−(Vin−)]. In response to the input differential signal, an output signal Vout1 is formed on the output terminal of the differential amplifier. Over a limited range of values for the input differential signal, the output signal Vout1 is representative of the input differential signal multiplied by a gain factor of the differential amplifier. Under such conditions, the differential amplifier acts as a linear amplifier. Outside this limited range of input values, the output Vout1 of the differential amplifier reaches a limiting value [i.e. nearly (Vcc) or (Vss)], depending upon the relative levels of the signals Vin+ and Vin−. Under such conditions, the differential amplifier acts as a level comparator.

When the input signals Vin+ and Vin− are equal, then the input differential signal is zero. Under such conditions, the output signal Vout1 should also be zero. In practice, however, the output Vout1 is typically non-zero. The output voltage formed when the input differential voltage is zero is known as output offset voltage. The output offset voltage is typically caused by process variations in the transistors which form the differential amplifier. When the differential amplifier is utilized as a linear amplifier, the output offset contributes to errors in the level of the output signal Vout1. When the differential amplifier is utilized as a level comparator, the output offset can result in the output Vout1 incorrectly indicating the result of the comparison, especially when the signal levels to be compared are close in value. Therefore, the output offset is ideally zero.

Initial adjustment procedures are typically undertaken during the manufacture of an integrated circuit which includes a differential amplifier in order to reduce or eliminate the output offset voltage of the differential amplifier. For example, fuses are blown or laser trimming is employed in order to adjust resistance values of load resistors placed in series with the transistors of the differential amplifier. An alternate approach has been to include one or more pins in the integrated circuit by which the output offset voltage is adjusted by resistor selection or potentiometer adjustment at the time of printed circuit board manufacture. However, the output offset voltage may vary over time, and with temperature and supply voltage levels, thereby reducing the effectiveness of these initial adjustment techniques.

Another prior technique for reducing the output offset voltage has been to provide a voltage source which adds to or subtracts from the input differential signal. For example, a first terminal of the voltage source receives the input voltage Vin+ (FIG. 1), while a second terminal of the voltage source is coupled to the gate of the transistor M3 (FIG. 1). The output signal Vout1 can be fed back through an integrator to adjust the voltage source in such a manner as to reduce or eliminate the output voltage offset. This technique has a drawback in that it can be difficult to implement.

Therefore, what is needed is an improved technique for reducing or eliminating the output offset voltage of a differential amplifier.

SUMMARY OF THE INVENTION

The invention is an apparatus for and a method of controlling amplifier output offset using body biasing in MOS transistors. An amplifier in accordance with the present invention includes a differential input stage having a pair of input MOS transistors. The pair of input MOS transistors are formed having isolated bodies. A differential input signal is applied across the gates of the input MOS transistors. Each of the input MOS transistors is appropriately biased and loaded. More particularly, the input MOS transistors are preferably NMOS transistors whose drains are coupled to a pair PMOS transistors. The pair of PMOS transistors are coupled to a high potential supply and form an active load for the input NMOS transistors. A first current source coupled to the sources of the input NMOS transistors and to a low potential supply serves to bias the input NMOS transistors.

An output of the amplifier is derived from a voltage formed at the drain of one of the input MOS transistors. More particularly, a single-ended output stage of the amplifier includes an output transistor where a gate of the output transistor is coupled to the drain of one of the input MOS transistors. The output transistor is preferably a PMOS transistor whose source is coupled to the high potential supply and whose drain is coupled to a second current source. The second current source biases the output transistor. An output node for the amplifier is formed at the drain of the output transistor.

A feedback loop includes an integrator and a feedback amplifier. The integrator receives an output signal from the output node and integrates the output signal, thereby forming an integrated output signal. The integrated output signal is applied to a first input of the feedback amplifier, while a reference voltage is applied to a second input of the feedback amplifier. The reference voltage is representative of a desired quiescent or dc level for the output signal. An output of the feedback amplifier is coupled to control the voltage of the body of one of the pair of input MOS transistors. The body of the other one of the pair of input MOS transistors is preferably coupled to its source.

According to the present invention, the threshold voltage of the input transistor having its body coupled to the feedback amplifier is controlled in such a manner as to reduce or eliminate the offset voltage. More particularly, assume that the gate of input transistor having its body coupled to the feedback amplifier is a non-inverting input of the amplifier. In which case, when the integrated output signal is lower than the reference voltage, the feedback loop will tend to increase the voltage applied to the body of the input transistor having its body coupled to the feedback amplifier. As a result, the output voltage tends to rise, which tends to increase the integrated output signal. Conversely, when the integrated output signal is higher than the reference voltage, the feedback loop tends to reduce the voltage applied to the body of the input transistor having its body coupled to the feedback amplifier. As a result, the output voltage tends to fall, which tends to reduce the integrated output signal. Thus, a quiescent or dc level of the output signal tends to be equal to the level of the reference voltage. This quiescent or dc level can be set to zero volts or to a non-zero level. A time constant associated with the feedback loop is sufficiently long that frequencies of interest for the input differential signal pass to the output of the amplifier after being amplified according to its gain and without affecting the bias voltage formed by the feedback loop.

A comparator in accordance with the present invention differs from the amplifier described above in that the integrator and feedback amplifier are omitted and, instead, a second reference voltage is applied directly to the body of the input transistor having its body voltage controlled. The offset voltage is reduced or eliminated by adjusting the second reference voltage. The signals to be compared are applied to the gates of the input transistors. Because the offset voltage is reduced, the output voltage accurately represents the relative levels of the input signals, even when the signals to be compared are close in value.

DETAILED DESCRIPTION OF A PREFERRED EMBODIMENT

Figure 1:
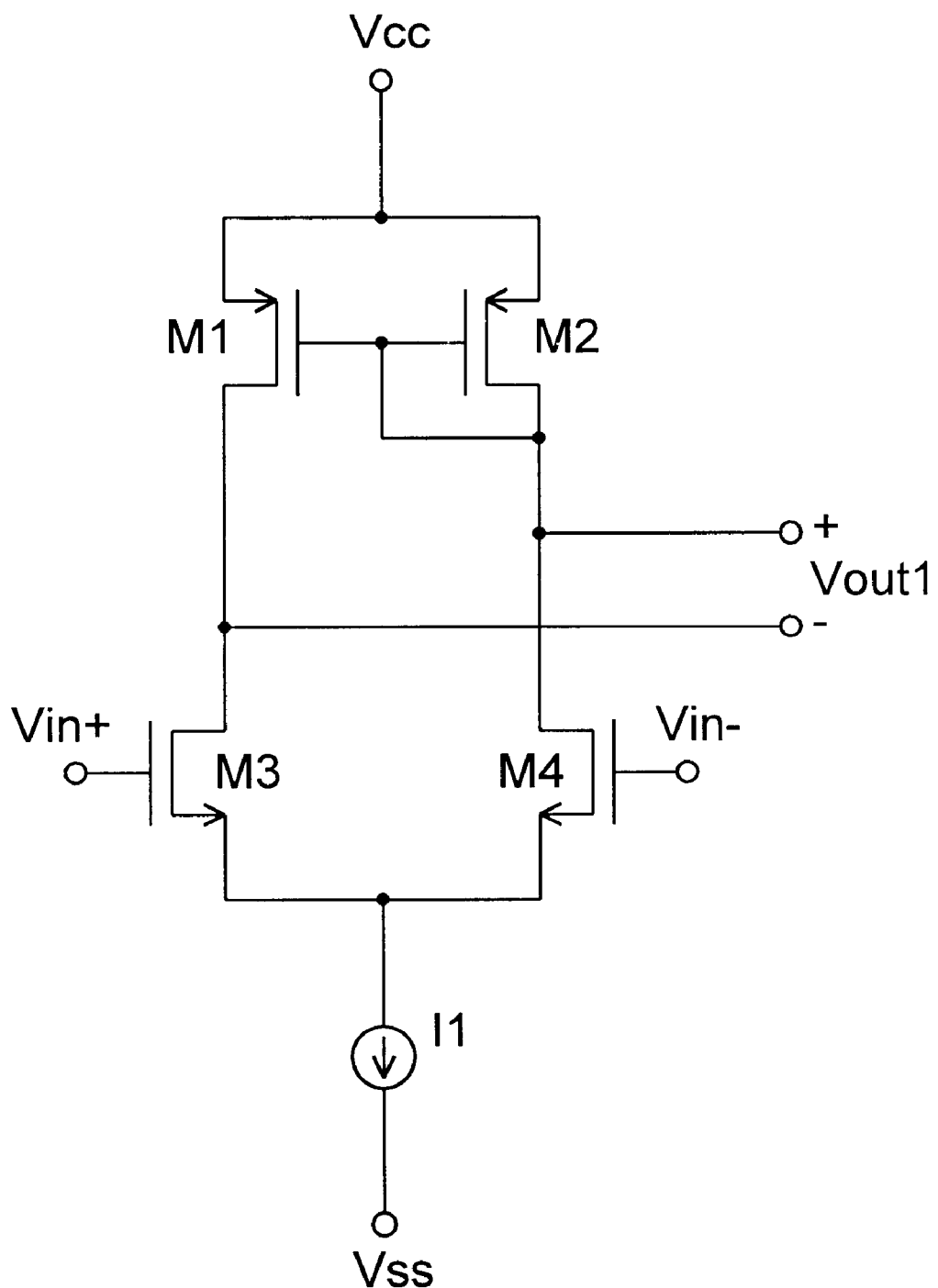
FIG. 1 illustrates a conventional differential amplifier circuit.
Figure 2:
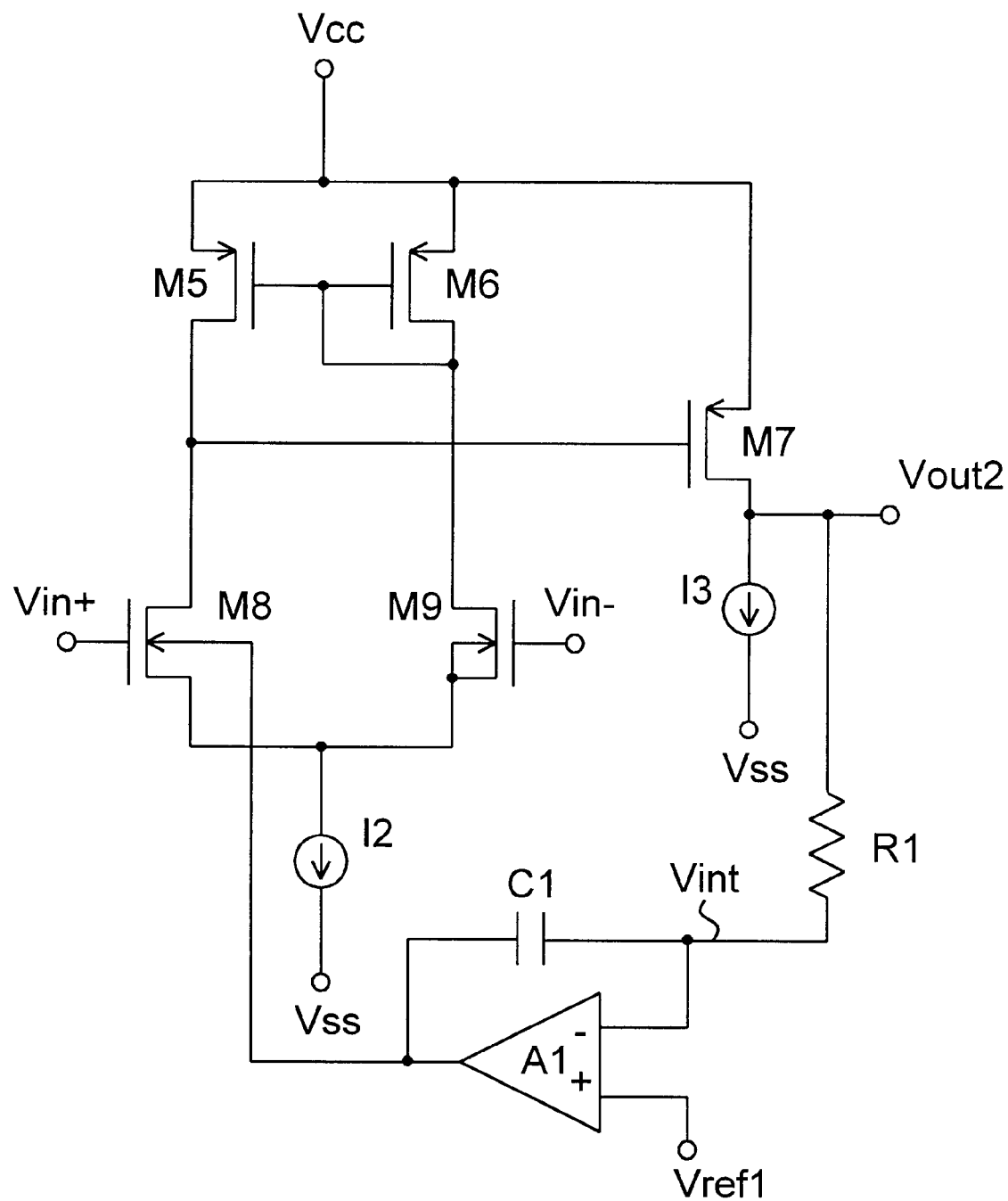
FIG. 2 illustrates an amplifier circuit in accordance with the present invention.

FIG. 2 illustrates an amplifier circuit in accordance with the present invention. A high potential supply $V_{cc}$ is coupled to a source of a PMOS transistor M5, to a source of a PMOS transistor M6 and to a source of a PMOS transistor M7. A drain of the transistor M5 is coupled to a gate of the transistor M7 and to a drain of an NMOS transistor M8. A drain of the transistor M6 is coupled to a gate of the transistor M5, to a gate of the transistor M6 and to a drain of an NMOS transistor M9. A gate of the transistor M8 forms a non-inverting input of the amplifier, while a gate of the transistor M9 forms an inverting input of the amplifier. The transistors M8 and M9 are formed in tubs such that their bodies are isolated and can be independently biased A source of the transistor M8 is coupled to a source of the transistor M9, to the body of the transistor M9 and to a first terminal of a current source I2. A second terminal of the current source I2 is coupled to a low potential supply Vss. The current source I2 provides bias current for the transistors M5, M6, M8 and M9.

The transistors M8 and M9 form a differential input pair while the transistors M5 and M6 form an active load for the differential input pair M8, M9. Together, the transistors M5, M6, M8 and M9 and the current source I2 form a differential input stage of the amplifier. It will be apparent that the differential input stage of the present invention can be altered while achieving the principal advantages of the present invention. For example, the body of the transistor M9 can alternately to coupled to the low potential supply Vss or to ground. Alternately, the active load M5, M6 can be replaced with a passive or resistive load. Further, the input transistors M8 and M9 can be replaced with PMOS transistors with appropriate modifications.

A drain of the transistor M7 forms an output of the amplifier and is coupled to a first terminal of a current source I3 and to a first terminal of a resistor R1. A second terminal of the current source I3 is coupled to the low potential supply Vss. The current source I3 provides bias current for the transistor M7. Together, the transistor M7 and the current source I3 form a single-ended output stage of the amplifier. It will be apparent that the output stage of the present invention can be altered while achieving the principal advantages of the present invention. For example, the output stage can be coupled to the drain of the transistor M9 in addition to, or instead of, being coupled to the drain of M8.

In the preferred embodiment, the current source I2 draws twice the level of current drawn by the current source I3. For example, the current source I2 draws 20 uA of current while the current source draws 10 uA of current. In addition, the transistors M5, M6 and M7 preferably have equal channel widths and lengths and the transistors M8 and M9 preferably have equal channel widths and lengths. For example, the transistors M8 and M9 M5, M6 and M7 each have a channel width of 5 um and a channel length of 1 um while the transistors each have a channel width of 2 um and a channel length of 1 um. It will be apparent, however, that other values can be selected for the current sources I2 and I3 and that other dimensions can be selected for the transistors M5–M9.

A second terminal of the resistor R1 is coupled to a first terminal of a capacitor C1 and to an inverting input of an amplifier A1 (feedback amplifier). A non-inverting input of the amplifier A1 is coupled to receive a reference voltage Vref1. The reference voltage Vref1 can be generated by conventional techniques. An output of the amplifier A1 is coupled to the body of the transistor M8 and to a second terminal of the capacitor C1. Thus, the amplifier A1 generates a bias voltage which is applied to the body of the transistor M8. Though, in the preferred embodiment, the body of the transistor M8 is controlled by the amplifier A1, it will be apparent that the body of the transistor M9 could be controlled by the amplifier A1, with appropriate modifications.

An input signal Vin+ is applied to the gate of the transistor M8, while an input signal Vin− is applied to the gate of the transistor M9. Together, the signals Vin+ and Vin− form an input differential signal [(Vin+)−(Vin−)]. In response to the input differential signal, an output signal Vout2 is formed at the drain of the transistor M7. The output signal Vout2 is representative of the input differential signal multiplied by a gain factor (K) of the amplifier. For example, when the input signal Vin+ is increased in relation to the input signal Vin−, the level of the current flowing through the transistor M8 is increased, while the level of current flowing through the transistor M9 is decreased by a corresponding amount. In response, a voltage applied to the gate of the transistor M7 is decreased and the output voltage Vout2 is increased. Conversely, when the input signal Vin+ is decreased in relation to the input signal Vin−, the level of current flowing through the transistor M8 is decreased, while the level of current flowing through the transistor M9 is increased by a corresponding amount. In response, the voltage applied to the gate of the transistor M7 is increased and the output voltage Vout2 is decreased.

The output voltage Vout2, can be given as:

$$Vout2 = K[(V_{GSM8} - V_{TM8}) - (V_{GSM9} - V_{TM9})]$$

where K is the gain of the amplifier circuit (an exemplary value of K is $10^5$); $V_{GSM8}$ is the gate-to-source voltage of the transistor M8; $V_{TM8}$ is the threshold voltage of the transistor M8; $V_{GSM9}$ is the gate-to-source voltage of the transistor M9; and $V_{TM9}$ is the threshold voltage of the transistor M9. When the input differential voltage is zero, then $V_{GSM8}=V_{GSM9}$. In which case, the output voltage Vout2 can be given as:

$$Vout2=K[V_{TM9}-V_{TM8}]$$

If the threshold voltages $V_{TM8}$ and $V_{TM9}$ are matched, then Vout2 is zero. Unless appropriate steps are taken, however, the transistors M8 and M9 can have threshold voltage differences in the range of a few millivolts (mV). Assuming the gain K is $10^5$, a threshold difference of 1 mV ($10^{-3}$ volts) would result in an output offset of 100 volts ($10^5 \times 10^{-3}$ volts=100 volts). This output offset voltage would likely exceed the supply voltages Vcc, Vss and, thus, would likely drive the output voltage Vout2 to one of the supply rails.

In accordance with the present invention, the threshold voltage of the transistor M8 is controlled by a feedback loop to be substantially equal to the threshold voltage of the transistor M9, thus, reducing the output offset voltage for the amplifier. The feedback loop includes the resistor R1, the capacitor C1 and the amplifier A1. The resistor R1 and the capacitor C1 form an integrator which integrates the output voltage Vout2 over time, thereby forming an integrated output signal Vint. Thus, the integrated output signal Vint is representative of the output voltage Vout2. The resistor R1 and the capacitor C1 can also be thought of as forming a filter which averages the output voltage Vout2 over time. The values of the resistor R1 and C1 determine a time constant associated with the integrator and, thus, a time constant associated with the feedback loop. The integrated output signal Vint is applied to the inverting input of the amplifier A1, while the reference voltage Vref1 is applied to the non-inverting input of the amplifier A1. A difference between the integrated output signal Vint and the reference voltage Vref1 is appropriately amplified by the amplifier A1 and applied to the body of the transistor M8.

The threshold voltage of the transistor M8 can be given as:

$$V_{TM8}=V_{T0}+\gamma[\sqrt{(2\phi_f+V_{SB})}-\sqrt{(2\phi_f)}]$$

where $V_{T0}$ is the threshold voltage of the transistor M8 with zero source-to-body bias; $\gamma$ is the body-effect parameter which is a function of properties of the transistor M8; $\phi_f$ is a semiconductor parameter; and $V_{SB}$ is the source-to-body voltage (bias) applied to the transistor M8. From this relationship, it can be seen that the threshold voltage $V_{TM8}$ for the transistor M8 is controlled by controlling its source-to-body voltage $V_{SB}$. More particularly, by increasing $V_{SB}$, $V_{TM8}$ is decreased and by decreasing $V_{SB}$, $V_{TM8}$ is increased. Because the output of the amplifier A1 is coupled to the body of the transistor M8, the amplifier A1 controls the source-to-body voltage $V_{SB}$ of the transistor M8.

Assume that Vin+ and Vin− are initially equal and that Vint is initially zero volts. Under these conditions, an output offset voltage would be expected at the output Vout2. The output offset is then integrated by the resistor R1 and the capacitor C1, thereby forming the signal Vint. Assume also that this signal Vint is greater than Vref1. As a result, the bias voltage $V_{SB}$ of the transistor M8 is decreased, which increases its threshold voltage $V_{TM8}$. This tends to reduce the output voltage Vout2. Conversely, assume that Vint is less than Vref1. As a result, the bias voltage $V_{SB}$ of the transistor is increased, which decreases its threshold voltage $V_{TM8}$. This tends to increase the output voltage Vout2.

Accordingly, the present invention operates to control the output offset voltage such that it is equal the reference voltage Vref1. According to an embodiment of the present invention, the reference voltage Vref1 is set to zero volts. In which case, the quiescent or dc level of the output voltage Vout2 is zero volts.

According to an alternate embodiment, the reference voltage Vref1 is set to a desired offset or dc level which is other than zero volts. In which case, the present invention operates to control the output voltage Vout2 to a non-zero quiescent or dc level which is equal to the reference voltage Vref1. As an example, this technique can be used to adjust the quiescent output level of each stage in a multiple-stage cascaded amplifier so as to eliminate the need for coupling capacitors inserted between the amplifier stages.

The time constant associated with the integrator is set by selecting the values of R1 and C1. For example, R1 can be 100 kohms and the capacitor C1 can be 1 nf, though it will be apparent that other values for R1 and C1 can be selected. The time constant for the integrator affects the speed at which the feedback loop alters the bias voltage $V_{SB}$ of the transistor M8. Preferably, this time constant is selected to be sufficiently long that the signals Vin+ and Vin− are expected to be within a range of frequencies which will not affect the bias voltage of the transistor M8. Though the integrator is illustrated in FIG. 2 as being implemented by the resistor R1 and the capacitor C1, it will be apparent that the integrator can be altered. For example, the second terminal of the capacitor C1 can be coupled to a fixed potential, such as the ground node, rather than to the output of the amplifier A1. Alternately, the output signal Vout3 can be digitally sampled and the samples integrated according to digital techniques. Further, it will be apparent that the integrator can be implemented utilizing switched-capacitor techniques.

Figure 3:
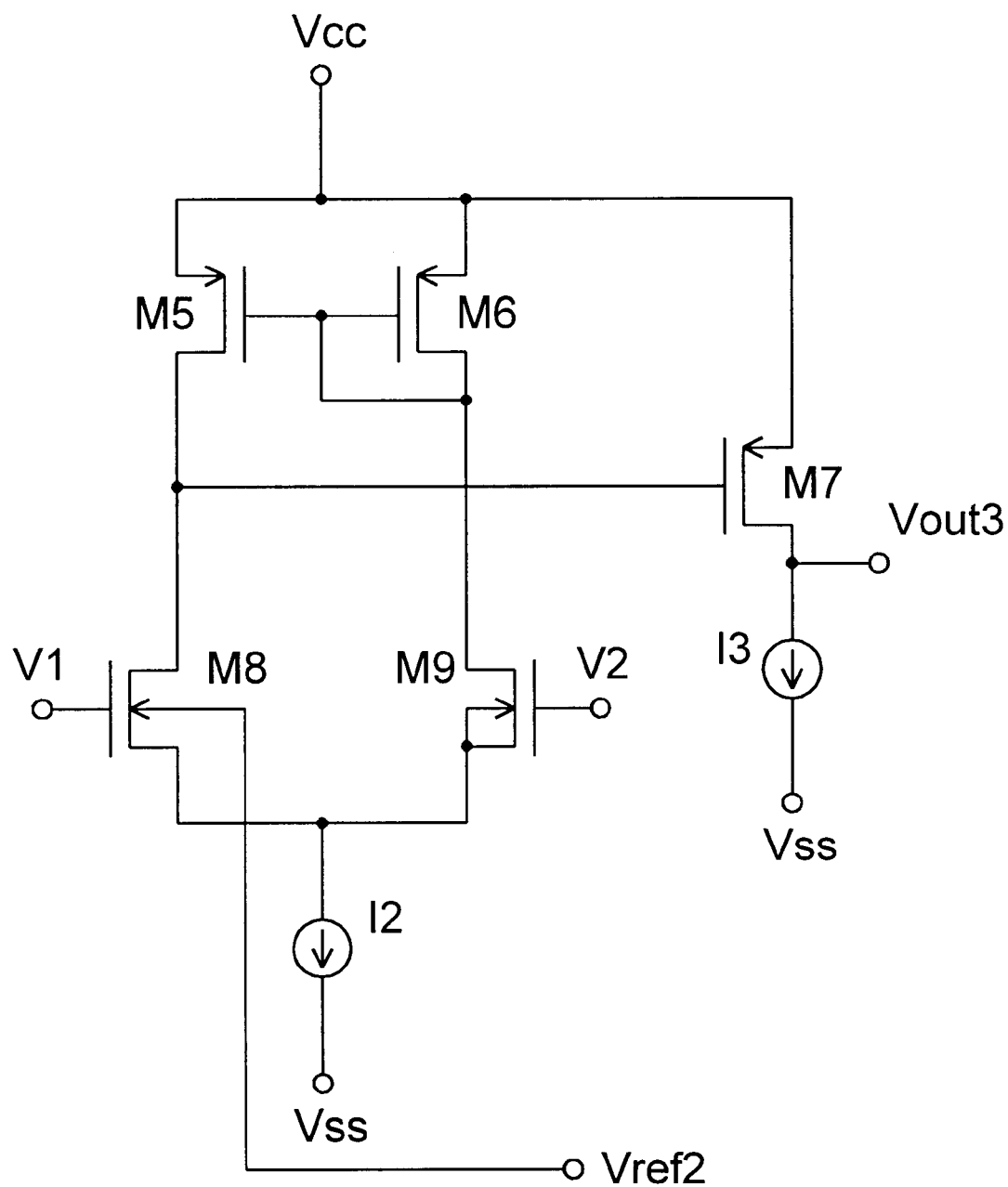
FIG. 3 illustrates a comparator circuit in accordance with the present invention.

FIG. 3 illustrates a comparator circuit in accordance with the present invention. Like the amplifier illustrated in FIG. 2, the comparator illustrated in FIG. 3 includes a differential amplifier input stage and an output stage. The comparator illustrated in FIG. 3 differs from the amplifier illustrated in FIG. 2 in that the integrator, including R1 and C1, and the feedback amplifier A1 are omitted and, instead, a reference voltage Vref2 is applied directly to the body of the input transistor M8. The reference voltage Vref2 can be generated by conventional techniques. Signals V1 and V2 to be compared by the comparator are applied to the gates of the input transistors M8 and M9, respectively. An output voltage Vout3 formed by the comparator can be at either of two logic levels, depending upon which of the signals V1, V2 is higher than the other. An offset voltage of the comparator is reduced or eliminated by adjusting the reference voltage Vref2. Because the offset voltage is reduced, the output voltage Vout3 of the comparator correctly indicates the relative levels of the input signals V1, V2 even when the input signals V1, V2 are close in value.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the preferred embodiment chosen for illustration without departing from the spirit and scope of the invention.

What is claimed is:

1. An apparatus for controlling a threshold voltage of a MOS transistor, the apparatus comprising:
   a. a MOS transistor having a body; and
   b. a voltage generator coupled to the body for forming a bias voltage at the body wherein a level of the bias voltage controls the threshold voltage of the MOS transistor and further wherein the bias voltage is controlled in a feedback loop, and wherein the feedback loop includes an integrator for integrating a signal formed by the transistor thereby forming an integrated signal.

2. The apparatus according to claim 1 wherein the bias voltage is representative of a difference between the integrated signal and a reference voltage.

3. The apparatus according to claim 2 wherein the reference voltage is representative of a quiescent level for the signal formed by the transistor.

4. The apparatus according to claim 3 wherein the signal formed by the transistor is formed in response to a input signal applied to a gate of the transistor.

5. An apparatus for controlling an output offset of an amplifier, the apparatus comprising:
   a. a MOS transistor having a source, a gate, a drain, and a body, wherein the source is coupled to a supply voltage; and
   b. a voltage generator coupled to the body for forming a bias voltage at the body wherein the bias voltage controls the threshold voltage of the MOS transistor and is representative of an output signal of the amplifier and further wherein the output offset of the amplifier is controlled according to a level of the bias voltage.

6. The apparatus according to claim 5 further comprising an integrator coupled to the voltage generator for integrating the output signal, thereby forming an integrated signal, and for providing the integrated signal to the voltage generator.

7. An apparatus for controlling output offset of an amplifier, the apparatus comprising:
   a. a MOS transistor having a source, a gate, a drain, and a body, wherein the source is coupled to a supply voltage; and
   b. a voltage generator coupled to the body for forming a bias voltage at the body and controls the threshold voltage of the MOS transistor and wherein a level of an output signal of the amplifier is controlled according to a level of the bias voltage and further wherein the bias voltage is controlled in a feedback loop, wherein the voltage generator is distinct from the supply voltage.

8. The apparatus according to claim 7 wherein the feedback loop includes an integrator for integrating the output signal thereby forming an integrated signal.

9. The apparatus according to claim 8 wherein the bias voltage is representative of a difference between the integrated signal and a reference voltage.

10. The apparatus according to claim 9 wherein the reference voltage is representative of a desired output offset of the amplifier.

11. The apparatus according to claim 10 wherein the output signal of the amplifier is formed in response to a input signal applied to a gate of the transistor.

12. An apparatus including a differential amplifier, the apparatus comprising:
   a. a differential amplifier having input pair of MOS transistors including a first MOS transistor having a body, and a second MOS transistor having a body;
   b. an output stage coupled to the input pair for forming an output of the amplifier; and
   c. a voltage generator coupled to the body of only one of the first MOS transistor and the second MOS transistor for forming a bias voltage at the body of that transistor.

13. The apparatus according to claim 12 wherein the body of the second MOS transistor is coupled to its source.

14. The apparatus according to claim 12 wherein the output stage comprises a third MOS transistor having its gate coupled to a drain of the first MOS transistor and wherein the output of the amplifier is formed at a drain of the third MOS transistor.

15. The apparatus according to claim 12 wherein the bias voltage is controlled in a feedback loop.

16. The apparatus according to claim 15 wherein the feedback loop includes an integrator for integrating the output signal thereby forming an integrated signal.

17. The apparatus according to claim 16 wherein the bias voltage is representative of a difference between the integrated signal and a reference voltage.

18. The apparatus according to claim 17 wherein the reference voltage is representative of a desired output offset of the amplifier.

19. The apparatus according to claim 18 wherein the desired output offset of the amplifier is non-zero.

20. The apparatus according to claim 18 wherein a differential input signal is applied to the input transistors.

21. The apparatus according to claim 12 wherein an offset voltage associated with the differential amplifier is adjusted by adjusting a level of the bias voltage.

22. The apparatus according to claim 21 wherein signals to be compared to each other are applied to the input transistors, one signal to be compared for each of the input transistors, and wherein the output signal is indicative of which of the signals to be compared is higher than the other.

23. A method of controlling a differential amplifier output offset, the method comprising steps of:
   a. receiving an input signal via a pair of input MOS transistors including a first MOS transistor having a body and a second MOS transistor having a body;
   b. forming an output signal representative of the input signal; and
   c. biasing the body of the first MOS transistor according to a level of the output signal.

24. The method according to claim 23 further comprising a step of coupling the body of the second MOS transistor to its source.

25. The method according to claim 23 wherein the step of biasing includes a step of forming a bias voltage with a feedback loop.

26. The method according to claim 25 wherein the step of biasing further comprises a step of integrating the output signal thereby forming an integrated signal.

27. The method according to claim 26 wherein the bias voltage is representative of a difference between the integrated signal and a reference voltage.

28. The method according to claim 27 wherein the reference voltage is representative of a desired output offset of the amplifier.

29. The method according to claim 28 wherein the output signal of the amplifier is formed in response to a input signal applied to a gate of the first MOS transistor.

* * * * *